US006901136B1

(12) United States Patent
Tekletsadik et al.

(10) Patent No.: US 6,901,136 B1
(45) Date of Patent: May 31, 2005

(54) X-RAY TUBE SYSTEM AND APPARATUS WITH CONDUCTIVE PROXIMITY BETWEEN CATHODE AND ELECTROMAGNETIC SHIELD

(75) Inventors: Kasegn Tekletsadik, Clifton Park, NY (US); John Price, Wauwatosa, WI (US)

(73) Assignee: GE Medical Systems Global Technology Co., LLC, Waukesha, WI (US)

( * ) Notice: Subject to any disclaimer, the term of this patent is extended or adjusted under 35 U.S.C. 154(b) by 0 days.

(21) Appl. No.: 10/707,269

(22) Filed: Dec. 2, 2003

(51) Int. Cl.[7] .................................................. H01L 35/02
(52) U.S. Cl. ........................................ 378/119; 378/121
(58) Field of Search ................................. 378/119, 121, 378/123, 136, 139, 142; 131/331, 318.12, 51, 49, 477 HC

(56) References Cited

U.S. PATENT DOCUMENTS 5,136,625 A * 8/1992 Heiting et al. .............. 378/139
6,236,713 B1 * 5/2001 True et al. .................. 378/138
6,570,962 B1 * 5/2003 Maska et al. ............... 378/140
6,798,865 B2 * 9/2004 Tang .......................... 378/119
2004/0096037 A1 * 5/2004 Tang et al. ................. 378/142

* cited by examiner

*Primary Examiner*—Edward J. Glick
*Assistant Examiner*—Hoon Song
(74) *Attorney, Agent, or Firm*—Peter J. Vogel

(57) ABSTRACT

An imaging tube (52, 52') includes a vacuum vessel (96) and an atmospheric-side supply line assembly (104, 104'). The vacuum vessel (96) has an internal vacuum (98). The supply line assembly (104, 104') has an electromagnetic shield (94, 94'). An insulator (106, 106') separates the internal vacuum (98) from an external atmosphere (126). A cathode post (92, 92') resides within the vacuum vessel (96). The cathode post (92, 92') is in conductive proximity with the electromagnetic shield (94, 94') and prevents the bending of electrostatic field lines within the imaging tube (52, 52').

23 Claims, 6 Drawing Sheets

X-RAY TUBE SYSTEM AND APPARATUS WITH CONDUCTIVE PROXIMITY BETWEEN CATHODE AND ELECTROMAGNETIC SHIELD

BACKGROUND OF INVENTION

The present invention relates generally to the high-voltage stability of computed tomography x-ray sources. More particularly, the present invention relates to the minimization of electrostatic field line bending within the triple point areas of an x-ray tube.

High-voltage stability of high power and high-voltage computed tomography (CT) x-ray sources, such as an x-ray tube, is essential to constructing, seasoning, testing, and placing of the x-ray sources in service. During manufacturing of an x-ray tube, the x-ray tube is assembled and tested. Following the manufacturing of the x-ray tube, the x-ray tube is further tested and calibrated during system assembly. Many of the test protocols and calibration procedures are more aggressive than the typical or anticipated protocols and procedures in actual endpoint customer use. A desire to withstand the rigorous protocols and procedures in addition to a desire for the quick and efficient execution thereof, results in a need for a highly robust x-ray source that satisfies rigorous high-voltage x-ray tube design requirements.

In single-ended or monopolar high-voltage x-ray tubes x-rays are generated by accelerating an electron beam across a vacuum gap between a cathode and a rotating anode. The cathode and the anode reside within a vacuum vessel, which is sometimes referred to as an insert or frame. High voltage is supplied to the cathode via a high voltage cable through a single high voltage insulator. In the case of anode-grounded x-ray tubes, the high voltage insulator can be at a negative potential with respect to the potential of a ground reference.

The high-voltage insulator isolates and separates the cathode from the walls of the insert, which are often approximately at the ground potential. In so doing, the insulator provides a vacuum seal between the cathode and the walls. The high-voltage cable penetrates the insert or vacuum vessel, via conductor pins, to provide high-voltage to the cathode. The high-voltage cable is coupled to the insert by a connector having a Faraday cage. The Faraday cage is typically in the form of a cylinder that encompasses and prevents high-voltage stress on and breakdown of the conductor pins, which provide conduction between the high-voltage cable and the cathode.

There are generally two main design features that aid in the high-voltage stability of the insert. The two main features are the design of a vacuum side and of an atmospheric-side of the high-voltage insulator. Vacuum-tight sealing techniques are used on the vacuum side of the insulator to prevent atmospheric gas leakage into the x-ray tube. The atmospheric-side includes the use of the connector having the Faraday cage. Since the connector is typically at ground potential, the Faraday cage is used to isolate and separate the conductor pins and the connector.

The insulator designs are hybrid in nature. The insulator provides high-voltage potential isolation and separation through use of air gaps and insulating material. The insulator also provides mechanical strength to maintain certain physical distances to sub-millimeter tolerances over a wide range of temperatures. The insulator provides a solid surface for the establishment of electrostatic potential, across which arcing can occur. The arc path may, for example, exist between a pair of high-voltage terminals, such as between the cathode and the insert walls.

The areas within the vacuum vessel along which the conductors and the insulator are adjacent to or are in contact with each other are referred to collectively as "triple point areas". High electric field stress is experienced both externally from and internally to the insulator near the cathode and conductors in the triple point areas.

The high electric field stress in the triple point areas can produce punctures in the insulator and electron emission through field emission effects and other hybrid microscopic mechanisms. Once the charges from the electron emission are separated from a solid surface, such as the cathode, and reside within the vacuum or the insulator they can accelerate under the effects of the electric fields and cascade to initiate arcs. The arcs can occur along the above stated paths. The arcing can damage, breakdown, and cause cracking of the insulator. Breakdown of the insulator can eventually cause air leaks and render the x-ray tube inoperable. The arcing can also result in atmosphere side flashovers, which can cause damage to other x-ray system componentry.

Thus, there exists a need for an improved x-ray tube design that minimizes high electric field stresses experienced within the triple point areas, while maintaining and satisfying present voltage potential differences and electric field performance standards and tolerances of an x-ray tube.

SUMMARY OF INVENTION

The present invention provides an imaging tube that includes a vacuum vessel and an atmospheric-side supply line assembly. The vacuum vessel has an internal vacuum. The supply line assembly has an electromagnetic shield. An insulator separates the internal vacuum from an external atmosphere. A cathode post resides within the vacuum vessel. The cathode post is in conductive proximity with the electromagnetic shield and prevents bending of electrostatic field lines within the imaging tube.

The embodiments of the present invention provide several advantages. One such advantage provided by multiple embodiments of the present invention is the provision of configuring an x-ray tube such that a cathode post is in conductive proximity with an electromagnetic shield of a high-voltage supply line assembly. In so doing, the stated embodiments prevent bending of electrostatic field lines within the x-ray tube. Prevention of the electrostatic field lines prevents arcing and breakdown of a high-voltage x-ray tube insulator, thus increasing life of the x-ray tube.

Furthermore, the present invention increases high-voltage stability of an x-ray tube, which in turn minimizes the manufacturing time of the x-ray tube. A decrease in the manufacturing time results in a reduction in x-ray tube cost and cycle time. The present invention increases ease in discriminating between a high-voltage stable tube and an unstable tube, such as a tube with contamination, insufficient exhaust or seasoning, loose foreign material, or a tube having surface contaminating films; all of which can compromise the high-voltage stability or performance of an x-ray tube.

Moreover, the present invention provides multiple techniques, which may be applied in multiple applications, for the configuration of a cathode post in conductive proximity with an electromagnetic shield.

The present invention itself, together with attendant advantages, will be best understood by reference to the following detailed description, taken in conjunction with the accompanying figures.

BRIEF DESCRIPTION OF DRAWINGS

For a more complete understanding of this invention reference should now be had to the embodiments illustrated in greater detail in the accompanying figures and described below by way of examples of the invention wherein.

DETAILED DESCRIPTION

Figure 1:
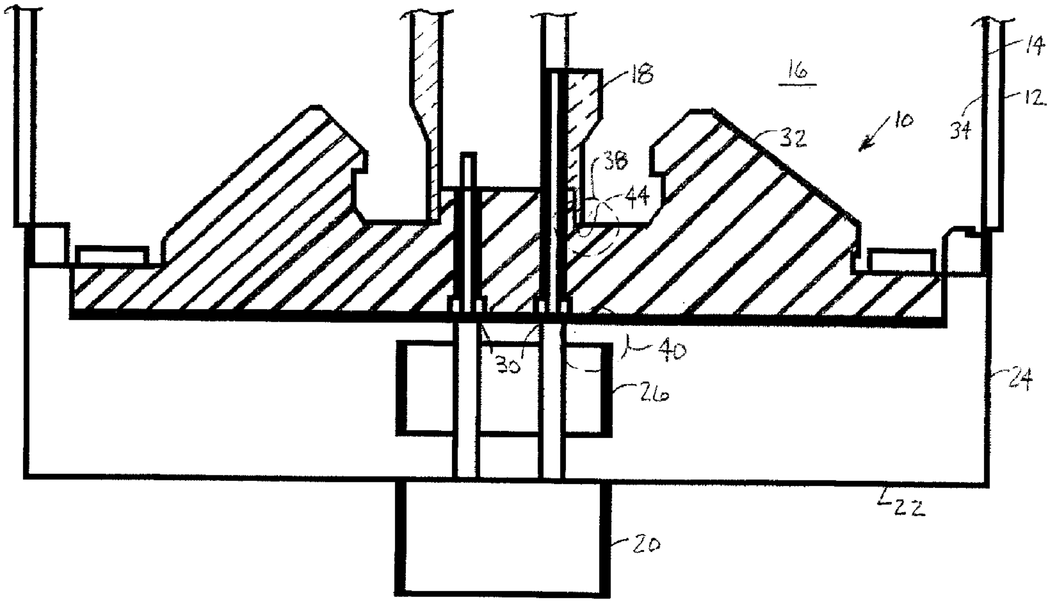
FIG. 1 (PRIOR ART)
FIG. 1 is a close-up cross-sectional view of a high-voltage insulator portion of a traditional x-ray tube.

Referring now to FIG. 1, a close-up cross-sectional view of a high-voltage insulator portion 10 of a traditional x-ray tube 12 is shown. The x-ray tube 12 has a vacuum vessel 14 with an internal vacuum 16. A cathode post 18 resides within the vacuum 16 and receives power from a high-voltage cable 20 via a high-voltage connector assembly 22. The connector assembly 22 includes a main connector 24 that is coupled to the vacuum vessel 14 and a Faraday cage 26. The Faraday cage 26 provides an electromagnetic shield around and prevents breakdown of connector connections 30.

A high-voltage insulator 32 is coupled between the cathode post 18 and walls 34 of the vacuum vessel 14, and along side the connector assembly 22. Notice that the cathode post 18 and the Faraday cage 26 are separated by the insulator 32 and the connector 24. A triple point area exists at a connection 44 between the cathode post 18 and the insulator 32 near the vacuum 16. A high field stress area exists in a region between the cage 26 and the insulator 32. The triple point area is designated by a dashed circle 38 and the high field stress area is designated by a dashed circle 40, is a region of high electric field non-uniformity. Areas 38 and 40 are areas of the triple point area 38 and the high field stress area 40 are shown in FIG. 2.

Figure 2:
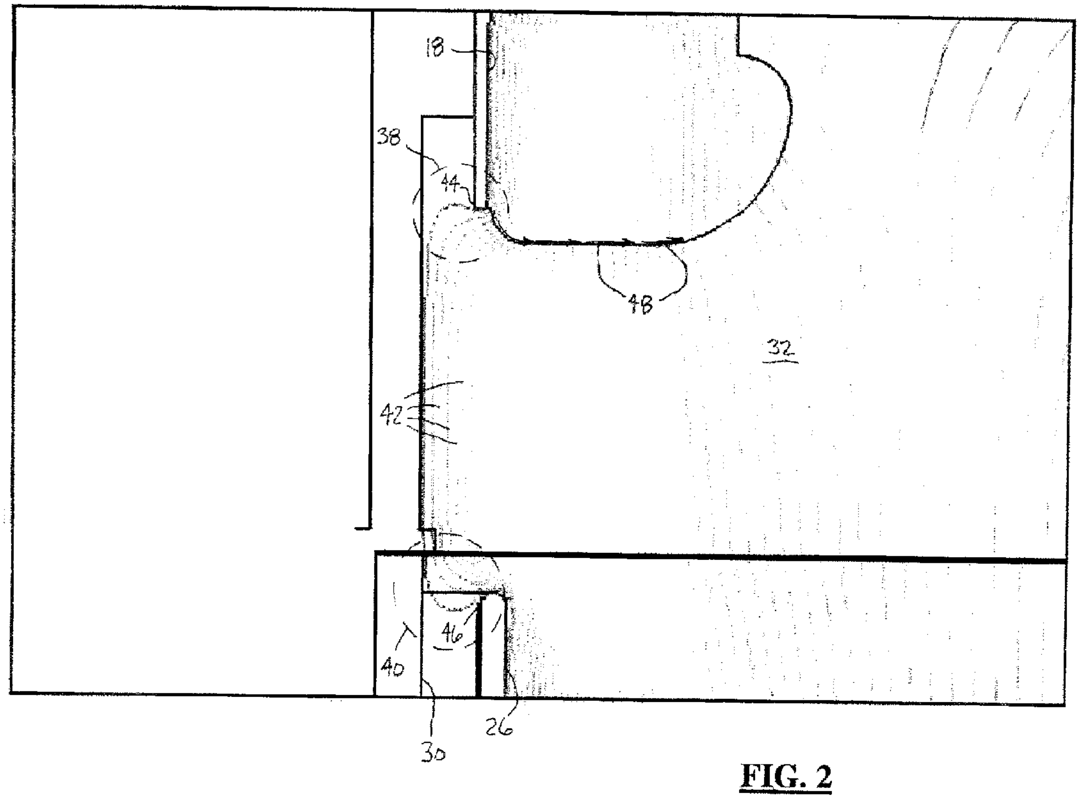
FIG. 2 (PRIOR ART)
FIG. 2 is a quarter close-up cross-sectional electrostatic field line representation view of the high-voltage insulator portion of FIG. 1.

Referring now to FIG. 2, a quarter close-up cross-sectional electrostatic field line representation view of the insulator portion 10 is shown. Electrostatic field lines 42 are shown as equipotential lines that generally extend along the cathode post 18 and the Faraday cage 26 and through the insulator 32. Notice that the field lines 42 bend within the insulator 32 around the end 44 of the cathode post 18 and the end 46 of the Faraday cage 26. This bending of the field lines 42 causes high electric field stress within the triple point area 38 and the high field stress area 40. The tighter the curvatures of the field lines 42 the higher the electric field stress. In general, tight bends of electric field lines exist at sharp corners and discontinuities in metallic shapes. Electrons are released from the solid into the vacuum from the end 44 and across the surface of the insulator 32, as represented by arrows 48. This is referred to as field effect emission. Over time, the field effect emission across the insulator 32 causes cracking in the insulator 32 and eventually causes the x-ray tube 12 to become inoperable. The multiple embodiments of the present invention prevent the bending of the electrostatic field lines within an x-ray tube, such as around a cathode post and a Faraday cage. The stated embodiments are described in detail below.

In the following figures the same reference numerals will be used to refer to the same components. While the present invention is described with respect to an apparatus for minimizing the bending of electrostatic field lines within triple point areas of an x-ray tube, the following apparatus is capable of being adapted for various purposes and is not limited to the following applications: computed tomography (CT) systems, radiotherapy systems, x-ray imaging systems, and other applications known in the art. The present invention may be applied to x-ray tubes, CT tubes, and other imaging tubes known in the art. The present invention may be applied in monopolar and bipolar imaging tubes.

In the following description, various operating parameters and components are described for one constructed embodiment. These specific parameters and components are included as examples and are not meant to be limiting.

Also, the term "triple point area" refers to areas within a vacuum vessel, of an imaging tube, along which high-voltage connections and a high-voltage insulator are adjacent to, proximate to, or are in contact with each other. The triple point areas may include areas that are external or internal to the insulator. Example triple point areas are shown in FIGS. 1, 2, 5, and 6.

Figure 3:
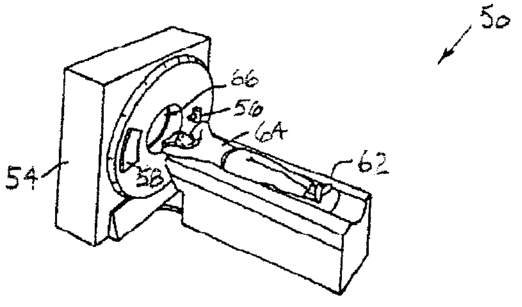
FIG. 3 is a schematic block diagrammatic view of a multi-slice CT imaging system utilizing an imaging tube in accordance with an embodiment of the present invention.
Figure 4:
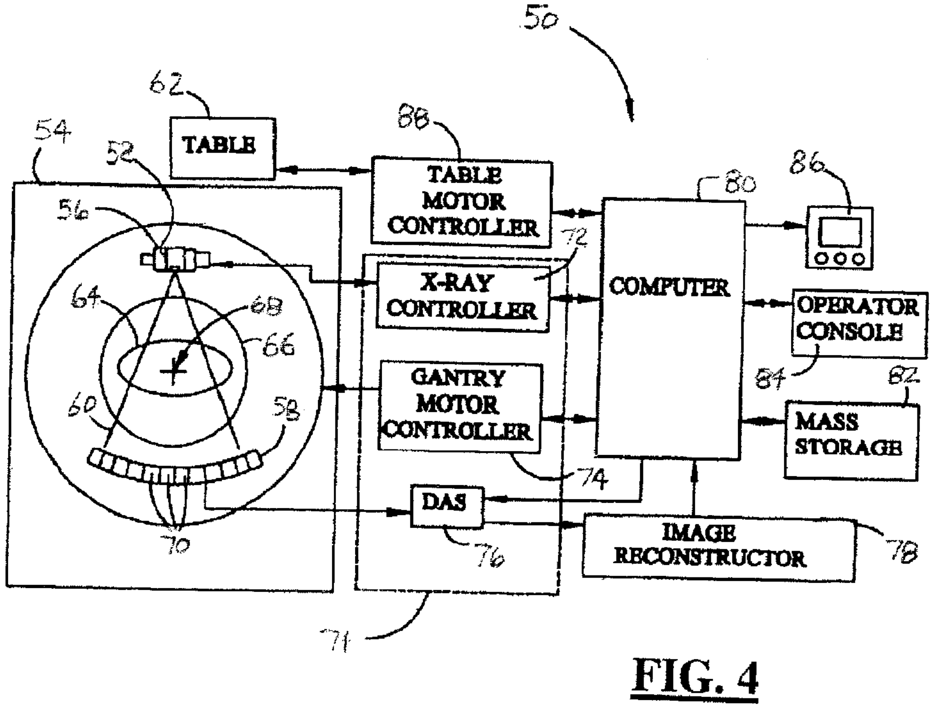
FIG. 4 is a block diagrammatic view of the multi-slice CT imaging system of FIG. 1 in accordance with an embodiment of the present invention.

Referring now to FIGS. 3 and 4, perspective and block diagrammatic views of a multi-slice CT imaging system 50 utilizing an imaging tube 52 in accordance with an embodiment of the present invention is shown. The imaging system 50 includes a gantry 54 that has an x-ray tube assembly 56 and a detector array 58. The assembly 56 has an x-ray generating device, such as the imaging tube 52. The tube 52 projects a beam 60 of x-rays towards the detector array 58. The tube 52 and the detector array 58 rotate about an operably translatable table 62. The table 62 is translated along a z-axis between the assembly 56 and the detector array 58 to perform a helical scan. The beam 60 after passing through a medical patient 64, within a patient bore 66, is detected at the detector array 58. The detector array 58 upon receiving the beam 60 generates projection data that is used to create a CT image.

The tube 52 and the detector array 58 rotate about a center axis 68. The beam 60 is received by multiple detector elements 70. Each detector element 70 generates an electrical signal corresponding to the intensity of the impinging x-ray beam 60. As the beam 60 passes through the patient 64 the beam 60 is attenuated. Rotation of the gantry 54 and the operation of tube 52 are governed by a control mechanism 71. The control mechanism 71 includes an x-ray controller 72 that provides power and timing signals to the tube 52 and a gantry motor controller 74 that controls the rotational speed and position of the gantry 54. A data acquisition system (DAS) 76 samples the analog data, generated from the detector elements 70, and converts the analog data into digital signals for the subsequent processing thereof. An image re-constructor constructor 78 receives the sampled and digitized x-ray data from the DAS 76 and performs high-speed image reconstruction to generate the CT image. A main controller or computer 80 stores the CT image in a mass storage device 82.

The computer 80 also receives commands and scanning parameters from an operator via an operator console 84. A display 86 allows the operator to observe the reconstructed image and other data from the computer. The operator supplied commands and parameters are used by the computer 80 in operation of the control mechanism 71. In addition, the computer 80 operates a table motor controller 88, which translates the table 62 to position patient 64 in the gantry 54.

Figure 5:
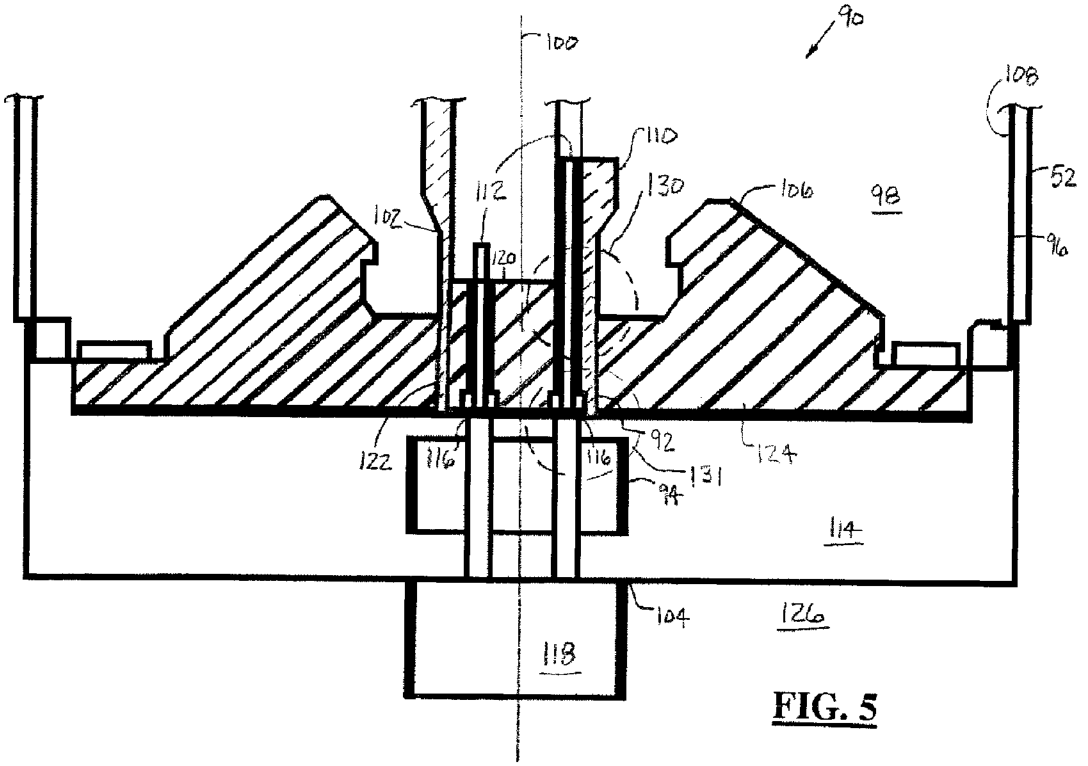
FIG. 5 is a close-up cross-sectional view of a high-voltage insulator portion of an x-ray tube having a cathode tube in conductive proximity with an atmospheric-side electromagnetic shield and in accordance with an embodiment of the present invention.

Referring now to FIG. 5, a close-up cross-sectional view of a high-voltage insulator portion 90 of the x-ray tube 52 having a cathode post 92 in conductive proximity with an atmospheric-side electromagnetic shield 94 and in accordance with an embodiment of the present invention is shown. The x-ray tube 52 has a vacuum vessel 96 with an internal vacuum 98 and a center axis 100. A cathode assembly 102 resides within the vacuum 98 and receives power from a high-voltage atmospheric-side supply line assembly 104. A high-voltage insulator 106 is coupled between the cathode assembly 104, walls 108 of the vacuum vessel 96, and the supply line assembly 104. The cathode post 92 extends through the insulator 106 such that it is in contact with the supply line assembly 104. The extension of the cathode post 92 minimizes the separation distance between the cathode post 92 and the shield 94. The minimal separation distance between the cathode post 92 and the shield 94 allows for electrical conductance therebetween.

The cathode assembly 102 includes the cathode post 92 that has an outer housing 110. Multiple cathode connections 112 reside within the outer housing 110 and are coupled to the supply line assembly 104.

The supply line assembly 104 includes a main connector 114 that is coupled to the vacuum vessel 96. The main connector 114 includes the shield 94 that may be in the form of a Faraday cage. The shield 94 encompasses and prevents breakdown of connector connections 116, within the connector 114, and at the interface between the insulator 106 and the connector 114 at the point of connection. The connector connections 116 receive power from a high-voltage cable 118 and supply power to the cathode connections 112. The main connector 114 and the shield 94 may be in various forms, shapes, and sizes.

The insulator 106 has a cathode post internal section 120, a cathode post channel 122, and an external section 124. The internal section 120 may reside entirely within the cathode post 92. The cathode post 92 resides within the channel 122. The insulator 106 isolates and separates the vacuum 98 from an atmosphere 126, which is external to the vacuum vessel 96. The insulator 106 also isolates and separates voltage potential between the cathode post 92, the supply line assembly 104, and the walls 108. The insulator 106 may be in the form of dielectric insulation, such as a thick ceramic insulator having high dielectric strength or may be in some other form known in the art. The insulator 106 may also be in various forms, shapes, and sizes.

A triple point area and a high field stress area, within the x-ray tube 52, are designated by dashed circles 130 and 131, respectively. Electrostatic field bending, within the triple point area 130, and in the high electric field stress area 131, is minimized due to the conductive proximity of the cathode post 92 with the shield 94. This can be seen in further detail in FIG. 6.

Figure 6:
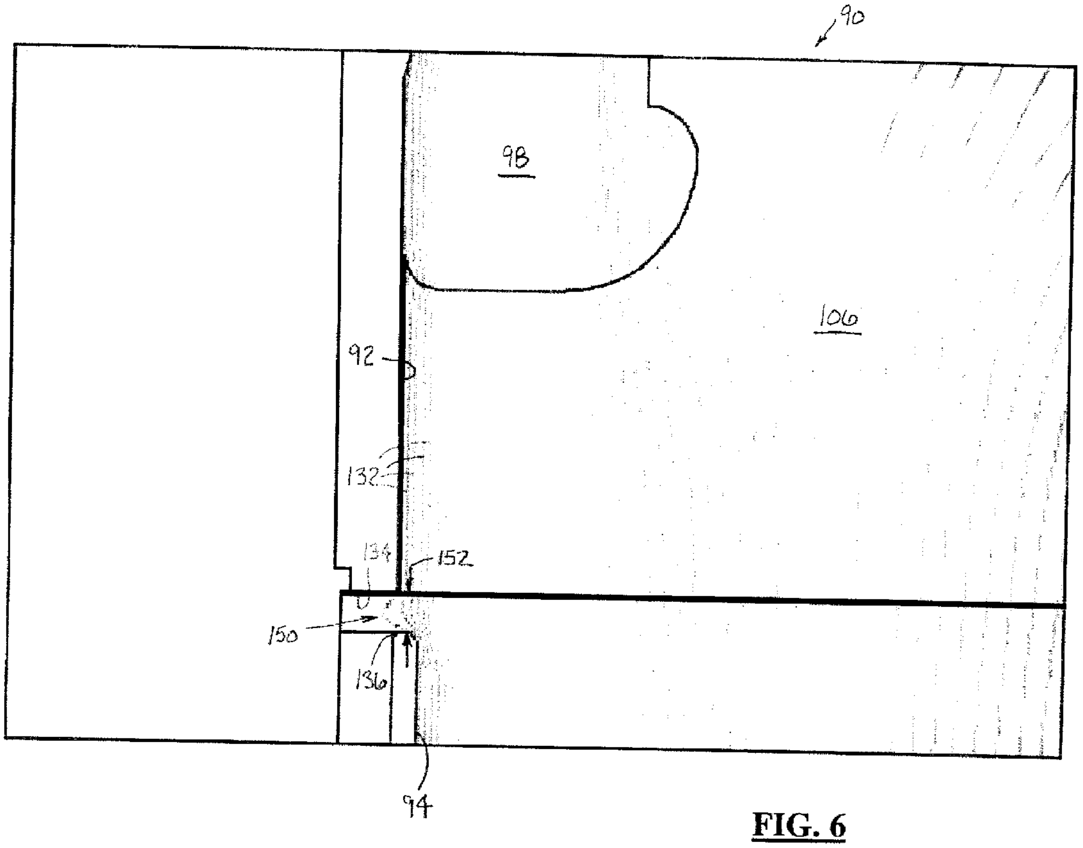
FIG. 6 is a quarter close-up cross-sectional electrostatic field line representation of the high-voltage insulator portion of FIG. 5 in accordance with an embodiment of the present invention and FIG. 7 is a close-up cross-sectional view of a high-voltage insulator portion of an x-ray tube with a cathode cup in conductive contact with an atmospheric-side electromagnetic shield and in accordance with an embodiment of the present invention.

Referring now to FIG. 6, a quarter close-up cross-sectional electrostatic field line representation of the insulator portion 90 of FIG. 5 in accordance with an embodiment of the present invention is shown. Notice that there is minimal bending of the electrostatic field lines 132 along the cathode post 92 and within the insulator 106. A minimal amount of bending exists between and around the end 134, of the cathode post, and the end 136, of the shield 94. The electromagnetic field stress within the x-ray tube 52, in the triple point area 130 and the high electric field stress area 131, is substantially smaller than the electromagnetic field stress within the x-ray tubes of prior art, such as that shown in FIG. 1. The field lines 132 more closely follow a true coaxial arrangement such that the field lines 132 are approximately parallel relative to the center axis 100 and terminate perpendicular to any solid metallic surfaces contained within the vessel 96, such as the cathode post 92 and the shield 94. The minimal amount of bending remaining is further eliminated by the embodiment of FIG. 7.

Figure 7:
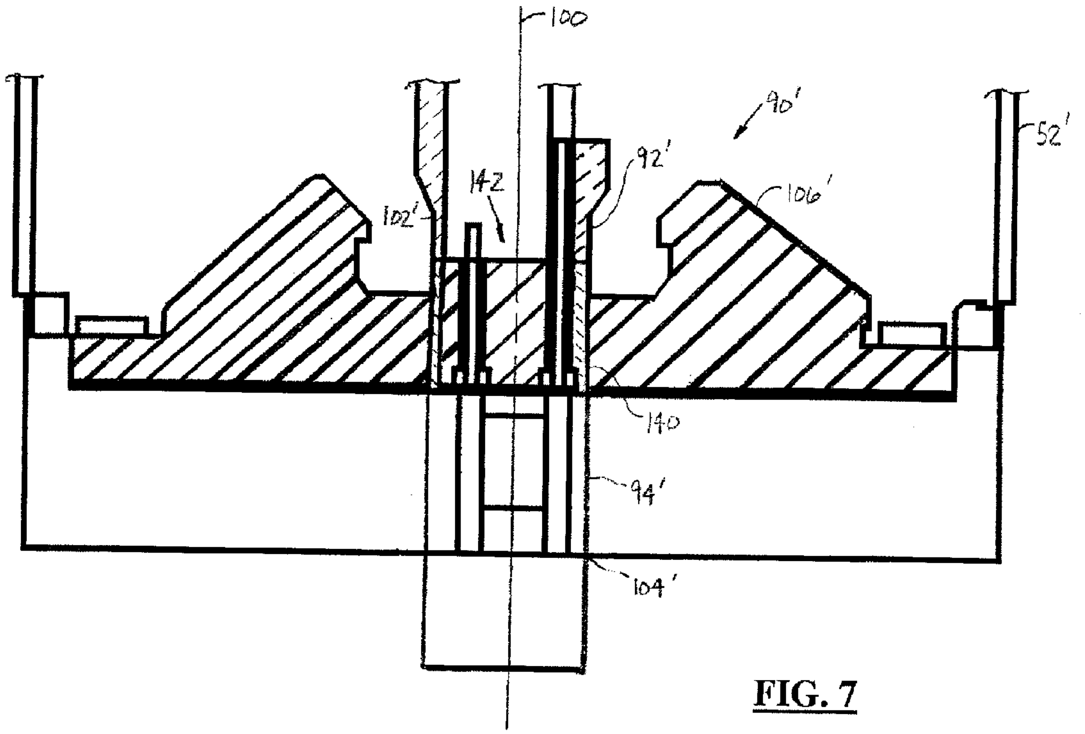

Referring now to FIG. 7, a close-up cross-sectional view of a high-voltage insulator portion 90' of an x-ray tube 52', with a cathode post 92' in conductive contact with an atmospheric-side electromagnetic shield 94', is shown in accordance with an embodiment of the present invention. FIG. 7 illustrates an alternative embodiment of the present invention. The x-ray tube 52' includes a cathode assembly 102', an insulator 106', and a supply line assembly 104'. The insulator 106' has a conducting element 140 that resides in a center portion 142 of the insulator 106'. The conductive element 140 is in conductive contact with the cathode post 92' and the supply line assembly 104'. Also, the shield 94' is extended along the center axis 100, further than that of the shield 94, such that it is in contact with the conductive element 140.

The conducting element 140 resides and conducts current between the cathode post 92' and the shield 94'. Although, the conducting element 140 is shown in the form of a conductive ring, the conducting element 140 may be in various forms, shapes, and sizes. The conducting element 140 may be formed of a metallic material or other conductive material known in the art.

The embodiment of FIG. 7 provides a continuous conductive connection between the cathode post 92' and the shield 94'. The continuous conductive connection eliminates the bending of electrostatic field lines along the cathode post 92' and the shield 94' within and external to the insulator 106'. The continuous conductive connection even minimizes the small amount of bending 150, shown in FIG. 6, between the cathode post 92 and the shield 94, by elimination of a gap 152 therebetween.

The present invention provides an x-ray tube with a minimal gap between a cathode post and an electromagnetic shield of a high-voltage supply line assembly. The reduction in the gap therebetween reduces the electric field stress in triple point areas and high electric field stress areas of the x-ray tube. The reduction in the electric field stress minimizes spit activity and increases high-voltage stability of the x-ray tube. The present invention minimizes the charge mobility due to the electric field acceleration along insulator surfaces and cascade-enhanced discharge initiation. The present invention also increases dielectric field strength of a high-voltage insulator of the x-ray tube.

The above-described apparatus and method, to one skilled in the art, is capable of being adapted for various applications and systems known in the art. The above-described invention can also be varied without deviating from the true scope of the invention.

What is claimed is:

1. An imaging tube comprising:

a vacuum vessel having an internal vacuum;

an atmospheric-side supply line assembly having an electromagnetic shield;

an insulator separating said internal vacuum from an external atmosphere; and a cathode post residing at least partially within said vacuum vessel, said cathode post in conductive proximity with said electromagnetic shield and preventing bending of electrostatic field lines within the imaging tube.

2. An imaging tube as in claim 1 wherein said cathode post comprises:

an outer housing; and a plurality of cathode connections residing within said outer housing.

3. An imaging tube as in claim 1 wherein said insulator comprises a cathode post channel and said cathode post is coupled within said cathode post channel.

4. An imaging tube as in claim 1 wherein said insulator comprises:

a cathode post internal section; and a cathode post external section.

5. An imaging tube as in claim 4 wherein said cathode post internal section resides entirely within said cathode post.

6. An imaging tube as in claim 1 wherein said cathode post is in contact with said atmospheric-side supply line assembly.

7. An imaging tube as in claim 1 wherein said cathode post is in conductive proximity with said electromagnetic shield such that bending of said electrostatic field lines is prevented within at least one triple point area of said x-ray tube.

8. An imaging tube as in claim 1 wherein said cathode post is in conductive proximity with said electromagnetic shield such that bending of said electrostatic field lines is prevented within at least one high electric field stress area of said x-ray tube.

9. An imaging tube as in claim 1 wherein said electromagnetic shield prevents bending of said electrostatic field lines internal to and external from said insulator.

10. An imaging tube as in claim 1 wherein said atmospheric-side supply line assembly comprises a Faraday cage that is proximate said cathode post.

11. An imaging tube as in claim 10 wherein said Faraday cage is in contact with said cathode post.

12. An imaging tube as in 1 wherein said atmospheric-side supply line assembly comprises:

a plurality of connections; and an electromagnetic shield encompassing said plurality of connections.

13. An imaging tube as in claim 12 wherein said atmospheric-side supply line assembly further comprises a connector coupling said atmospheric-side supply line assembly to said vacuum vessel.

14. An imaging tube as in 1 wherein said insulator comprises an insulator conducting element, said insulator conducting element residing and conducting current between said cathode post and said atmospheric-side supply line assembly.

15. An imaging tube as in claim 14 wherein said insulator conducting element is in the form of a conductive ring.

16. An imaging tube as in claim 14 wherein said insulator conducting element is metallic.

17. An imaging tube as in claim 14 wherein said insulator conducting element is in contact with said cathode post and said atmospheric-side supply line assembly.

18. An imaging tube as in claim 14 wherein said insulator conducting element is in contact with said cathode post and said electromagnetic shield.

19. An imaging tube as in claim 1 wherein said insulator is formed at least partially of a ceramic material.

20. An imaging system comprising:

an imaging tube comprising;

a vacuum vessel having an internal vacuum;

an atmospheric-side supply line assembly having an electromagnetic shield;

an insulator separating said internal vacuum from an external atmosphere; and a cathode post residing at least partially within said vacuum vessel, said cathode post in conductive proximity with said electromagnetic shield and preventing bending of electrostatic field lines within the imaging tube.

21. An imaging system as in claim 20 wherein said cathode post is in conductive proximity with said electromagnetic shield such that bending of said electrostatic field lines is prevented within at least one triple point area or high electric field stress area of said x-ray tube.

22. An image tube comprising:

a vacuum vessel having an internal vacuum;

an atmospheric-side supply line assembly having an electromagnetic shield and coupling said vacuum vessel;

an insulator separating said internal vacuum from an external atmosphere; and a cathode post residing at least partially within said vacuum vessel, said cathode post extending substantially within said insulator, contacting said electromagnetic shield, and preventing bending of electrostatic field lines within the imaging tube.

23. An imaging tube as in claim 22 wherein said electromagnetic shield prevents bending of said electrostatic field lines internal to and external from said insulator.

* * * * *